United States Patent
Obayashi et al.

(10) Patent No.: US 8,733,199 B2
(45) Date of Patent: May 27, 2014

(54) GEARS AND ITS PROCESS OF MANUFACTURE

(75) Inventors: Koji Obayashi, Toyoake (JP); Keita Taguchi, Agui (JP); Susumu Kato, Anjyo (JP); Shuji Kozawa, Muroran (JP); Manabu Kubota, Muroran (JP); Yuji Adachi, Tokai (JP); Hirokazu Sato, Tokai (JP)

(73) Assignees: Aisin AW Co., Ltd., Anjo (JP); Nippon Steel Corporation, Tokyo (JP)

( * ) Notice: Subject to any disclaimer, the term of this patent is extended or adjusted under 35 U.S.C. 154(b) by 0 days.

(21) Appl. No.: 13/064,685

(22) Filed: Apr. 8, 2011

(65) Prior Publication Data
US 2012/0247249 A1    Oct. 4, 2012

Related U.S. Application Data

(63) Continuation of application No. PCT/JP2011/057937, filed on Mar. 30, 2011.

(51) Int. Cl.
*F16H 55/08*     (2006.01)
*F16H 55/10*     (2006.01)

(52) U.S. Cl.
USPC ................................ 74/457; 148/586; 74/434

(58) Field of Classification Search
USPC .............. 74/434, 457–462; 29/893.1–893.37; 148/206–238, 49, 486
See application file for complete search history.

(56) References Cited

U.S. PATENT DOCUMENTS

| | | | | |
|---|---|---|---|---|
| 5,310,432 A * | 5/1994 | Fukui et al. | | 148/330 |
| 5,390,414 A * | 2/1995 | Lisowsky | | 29/893.34 |
| 6,315,841 B1 * | 11/2001 | Fisher et al. | | 148/328 |
| 7,416,696 B2 * | 8/2008 | Kosco | | 419/28 |
| 7,566,373 B2 | 7/2009 | Takayama | | |
| 7,641,747 B2 | 1/2010 | Takayama | | |
| 7,662,245 B2 * | 2/2010 | Ohta et al. | | 148/330 |

(Continued)

FOREIGN PATENT DOCUMENTS

| | | |
|---|---|---|
| CN | 101184860 | 5/2008 |
| JP | A-08-311607 | 11/1996 |

(Continued)

OTHER PUBLICATIONS

Jul. 12, 2011 International Search Report issued in PCT/JP2011/057934 (with translation).

(Continued)

*Primary Examiner* — Troy Chambers
*Assistant Examiner* — Alexander Vu
(74) *Attorney, Agent, or Firm* — Oliff PLC

(57) ABSTRACT

A method of manufacturing a gear, and the resulting gear, the method resulting such that the surface layer portions of the tooth portions and a tooth root portion are made to be a carburized layer, the remaining portion of the tooth portions and a portion of a disk portion lying below the carburized layer be a quench-hardened layer, and a region of the disk portion lying deeper than the quench-hardened layer be an unquenched layer. The gear is manufactured using raw material steel having the following chemical composition: C: 0.1% to 0.40% (% by mass), Si: 0.35% to 3.0%, Mn: 0.1% to 3.0%, Cr: less than 0.2%, Mo: 0.1% or less, P: 0.03% or less, S: 0.15% or less, Al: 0.05% or less, N: 0.03% or less, and Fe and unavoidable impurities.

13 Claims, 9 Drawing Sheets

(56) References Cited

U.S. PATENT DOCUMENTS

| | | | |
|---|---|---|---|
| 2005/0279430 A1* | 12/2005 | Hoffman et al. | 148/586 |
| 2007/0102068 A1 | 5/2007 | Taniguchi et al. | |
| 2007/0246135 A1* | 10/2007 | Pollard | 148/579 |
| 2007/0283778 A1* | 12/2007 | Ichikawa et al. | 74/457 |
| 2008/0247901 A1 | 10/2008 | Morita et al. | |
| 2009/0126838 A1* | 5/2009 | Silvia et al. | 148/660 |
| 2009/0266449 A1 | 10/2009 | Ohbayashi et al. | |
| 2009/0301608 A1* | 12/2009 | Taniguchi et al. | 148/319 |
| 2010/0084051 A1 | 4/2010 | Mizuno et al. | |
| 2012/0247249 A1* | 10/2012 | Obayashi et al. | 74/434 |
| 2012/0247619 A1 | 10/2012 | Obayashi et al. | |

FOREIGN PATENT DOCUMENTS

| | | |
|---|---|---|
| JP | A-2006-009145 | 1/2006 |
| JP | A-2008-280610 | 11/2008 |
| JP | A-2009-228049 | 10/2009 |
| WO | WO 2006/118242 | 11/2006 |
| WO | WO 2006/118243 | 11/2006 |
| WO | WO 2007/034911 | 3/2007 |
| WO | WO 2010/041561 | 4/2010 |

OTHER PUBLICATIONS

Aug. 28, 2013 Office Action issued in Application No. 201180010221.1 (English Translation Only).

Obayashi et al., U.S. Appl. No. 13/064,686, filed Apr. 8, 2011.

Jul. 12, 2011 International Search Report issued in PCT/JP2011/057935.

Jan. 3, 2013 Office Action issued in U.S. Appl. No. 13/064,686.

Apr. 11, 2013 Office Action issued in U.S. Appl. No. 13/064,686.

Jul. 5, 2013 Advisory Action issued in U.S. Appl. No. 13/064,686.

* cited by examiner

F I G . 2
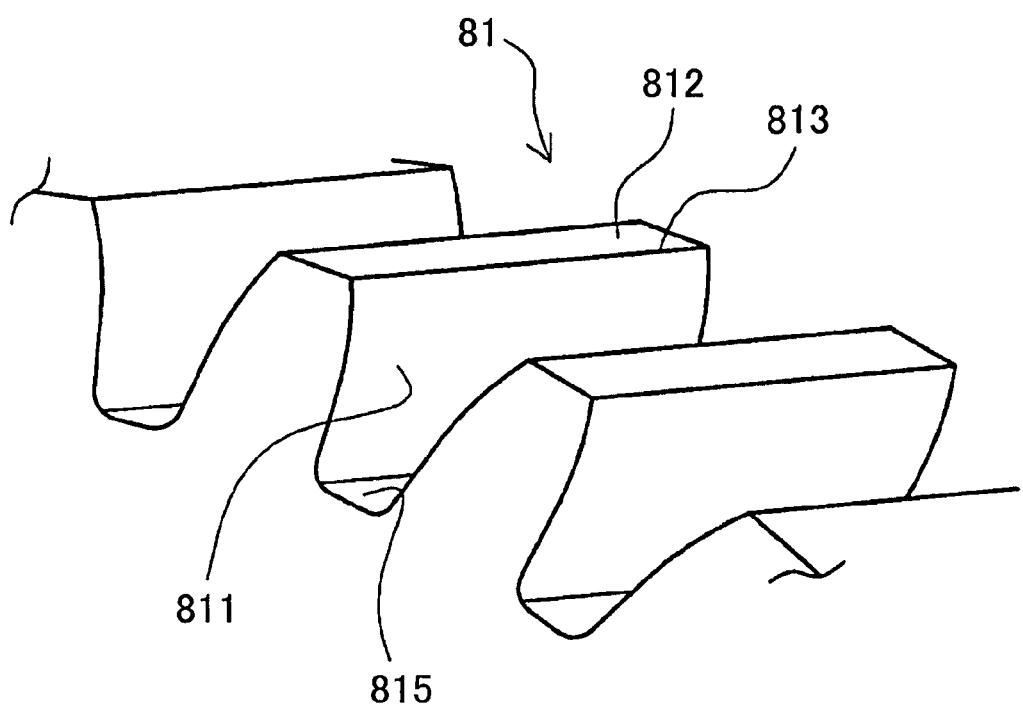

F I G . 6
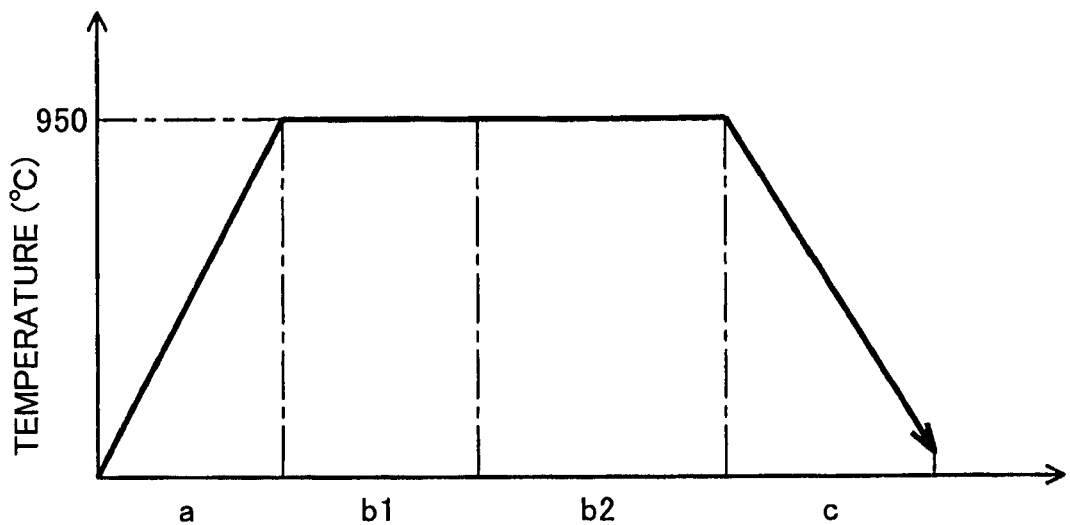
F I G . 7
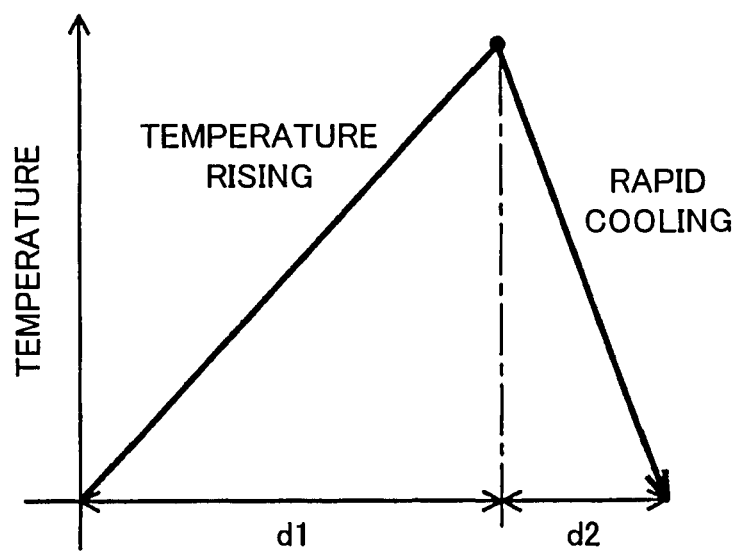

GEARS AND ITS PROCESS OF MANUFACTURE

INCORPORATION BY REFERENCE

The disclosure of Japanese Patent Application No. 2010-079437 filed on Mar. 30, 2010 including the specification, drawings and abstract is incorporated herein by reference in its entirety.

BACKGROUND OF THE INVENTION

The present invention relates to a gear, such as a differential ring gear in a vehicle drive train system, that is used for transmitting such high torque as to produce a stress not only in a surface layer portion but also in a core portion, and to a manufacturing method of the gear. More in detail, the present invention relates to a gear that is made of steel as raw material and is hardened through processes such as carburizing and quenching, and to a manufacturing method of the gear.

DESCRIPTION OF THE RELATED ART

A steel member such as a gear is often processed with carburizing and quenching treatment serving as treatment for increasing the surface hardness while maintaining the toughness of the steel member. Hereinafter, a steel member processed with carburizing treatment will be referred to as a carburized steel member where appropriate. The carburizing and quenching treatment is a treatment for increasing the surface hardness of a steel member while ensuring the toughness of a core portion of the steel member by quenching the steel member after applying to the steel member carburizing treatment to increase the surface carbon concentration of the steel member in the state in which the steel member is heated to the austenitizing temperature or higher. Various methods have been proposed heretofore as methods for manufacturing a steel member by applying the carburizing and quenching treatment. For example, in WO 2006/118242, steel raw material containing Cr and Mo is subjected to processes such as carburizing, slow cooling, and quenching by high-frequency heating.

SUMMARY OF THE INVENTION

In the case of steel raw material with a high content (for example, 0.2% by mass or more) of Cr as disclosed in the related art, Cr carbide is formed in a pearlite structure and a ferrite structure in a carburized layer when the steel raw material is slowly cooled after being carburized. Then, the Cr carbide is dissolved in a matrix by performing the high-frequency heating at a relatively high temperature (for example, at 950° C. or higher) after the slow cooling. Consequently, austenite transformation occurs uniformly during the high-frequency heating, and thus a uniform quenched structure is obtained. As a result, uniform hardness is also obtained. On the other hand, if the high-frequency heating is performed at a relatively low temperature (for example, at lower than 950° C.) after the slow cooling, the Cr carbide is hardly dissolved in the matrix. Consequently, the austenite transformation occurs nonuniformly, causing the quenched structure to be also nonuniform. This phenomenon serves as a factor of occurrence of nonuniformity of hardness.

For the same reason, a high content (for example, 0.1% by mass or more) of Mo also serves as a factor of occurrence of nonuniformity of hardness, though not to the same extent as in the case of Cr. This is because Mo also forms carbide during the slow cooling after the carburizing. In other words, in order to obtain a uniform quenched structure in the case of steel raw material with a high content of Cr or Mo, the high-frequency heating after the slow cooling needs to be performed at a relatively high temperature.

Here, when a steel member is used for a gear, a surface layer portion thereof is required to have high hardness whereas an inner layer portion thereof is required to have high toughness rather than hardness. In addition, high shape accuracy is required. In order to obtain both the high hardness of the surface layer portion and the high toughness of the inner layer portion, it is necessary to perform quenching by heating only the surface layer portion of the gear in a profiling manner when applying induction hardening. In order to achieve this, the induction hardening needs to be performed with a high output in a short time. By suppressing the heating time to be short, heat conduction to the inner layer portion is suppressed so as to achieve the heating in a profiling manner. Because the heating output is made high by a corresponding amount, the surface layer portion is heated to a relatively high temperature. Particularly, a tooth tip portion may almost melt.

By using the heating method as described above, it is possible to obtain a uniform quenched structure in the surface layer portion including the tooth tip because the Cr carbide or the Mo carbide dissolves in the matrix as described above. Note that, although a surface layer portion of a tooth root portion is slightly lower in temperature (for example, at approximately 950° C.) than that of the tooth tip portion, the temperature is not low enough so as to produce nonuniformity of hardness. This is because the high-frequency heating itself is performed with a high output.

Some gears are used in a vehicle drive train system, particularly for a differential ring gear, for transmitting very high torque. In such a use, a stress is applied not only to the surface layer portion of the gear, but also to the inside of the gear. Therefore, the hardness is required not only of the surface layer portion, but also of a deep layer portion lying deeper than the surface layer portion. Consequently, not only the surface layer portion, but also the deep layer portion, particularly the inside of a tooth portion, needs to be increased in temperature to or above an austenite transformation temperature during quenching treatment. However, it is not appropriate to increase the temperature of the entire gear to or above the austenite transformation temperature. The reason for this is that, if the entire gear is transformed into austenite, the shape accuracy deteriorates because of volumetric expansion associated with martensitic transformation during rapid cooling after the austenite transformation. This causes problems such as occurrence of noise when the gear is used.

Therefore, a portion in a somewhat thick range including the surface layer and the deep layer portion therebelow is increased in temperature to or above the austenite transformation temperature without increasing the temperature of the inner layer portion of the gear to or above the austenite transformation temperature. In this case, the heat conduction from the surface layer to the deep layer portion is actively used. Therefore, in contrast to the above, the heating time needs to be long to a certain extent, and the heating output results in being smaller by a corresponding amount. As a result, the tooth tip portion is prevented from overheating, thereby resulting in the heating with a relatively good temperature distribution.

However, in this case, the following two problems occur. First, the austenite transformation is made at a relatively low temperature during the quenching treatment. Consequently, if the content of Cr or Mo is high, some of the Cr carbide or the Mo carbide may remain undissolved in the matrix even by heating during the quenching treatment. This remnant carbide causes a loss in hardness or nonuniformity of hardness.

Secondly, there is a problem in a place lying slightly deeper than the surface layer portion. In the case of the high-frequency heating, the temperature is lower in the deep place than in the surface layer portion. Therefore, even in the range of the carburized layer, the problem of the remnant carbide is more likely to occur in the place deeper than the surface layer portion than in the surface layer portion. In such a place, nonuniformity of hardness is more likely to occur than in the surface layer portion.

In view of the problems described above, it is an object of the present invention to provide a gear that is free from nonuniformity of hardness while having high hardness in the surface layer portion and the deep layer portion thereof as well as high shape accuracy, and to provide a manufacturing method of the gear.

As described above, the present invention specializes in a gear of a carburized steel member and a manufacturing method for producing the gear through a carburizing process conducted under a reduced pressure, a cooling process to perform slow cooling under the particular conditions described above, and a quenching process employing the heating by high-density energy. In the present invention, the chemical composition within the above-specified range is employed as an optimal chemical composition for producing the gear by this manufacturing method. Points to be noted in the above-specified chemical composition are that the contents of Cr and Mo are confined within levels to be contained as impurities, or, if added, are limited to less than 0.2% and 0.1% or less, respectively.

Cr, when added at a concentration of less than 0.2%, is an effective element for improving hardenability and for increasing resistance to temper softening. On the other hand, if Cr is added at a concentration of 0.2% or more, Cr carbide is formed in a pearlite structure and a ferrite structure in a carburized layer during the slow cooling after the carburizing treatment. The Cr carbide, unless dissolved in a matrix during the subsequent quenching process, produces a nonuniform quenched structure, thereby causing occurrence of nonuniformity of hardness. However, if the heating is performed in a very short time by using high-density energy as in the present invention, it is difficult to dissolve the Cr carbide in a solid state in the matrix.

Therefore, in the present invention, as described above, Cr is actively treated as an optional component, and the content of Cr, if contained, is limited to the concentration of less than 0.2%. As a result, the Cr carbide is prevented from being formed during the slow cooling described above. Consequently, even if a heating unit in the quenching process performs heating by using high-density energy, the Cr carbide, if any present before the heating, can be dissolved in a solid state in the matrix in a sure manner, thus making it possible to reduce structural nonuniformity. In addition, raw material cost can be reduced by reducing the additive amount of expensive Cr.

Mo is an effective element for improving hardenability and for increasing resistance to temper softening. However, in the present invention, because the required hardenability is ensured by adding appropriate amounts of Si and Mn (particularly Si), a uniform martensitic structure can be obtained without relying on the hardenability improvement effect by Mo. Accordingly, as described above, by limiting the heating unit in the quenching process to the heating by using high-density energy, the raw material cost can be reduced while making it possible to improve productivity of the carburizing treatment. If the content of Mo is large, Mo carbide is formed.

The Mo carbide can further worsen the structural nonuniformity in combination with the structural nonuniformity caused by Cr. Therefore, the additive concentration of Mo is limited to 0.1% or less so as to obtain an effect to reduce the structural nonuniformity.

In the gear of the present invention, the following effects are obtained by the raw material steel and the manufacturing method described above. First of all, it can be stated that grain boundary oxidation is suppressed by performing the carburizing in a carburizing atmosphere of a lower oxygen concentration than that of the atmosphere. In addition, the effect of the quenching is exerted not only on a surface layer (first quench-hardened layer), but also on a portion therebelow (second quench-hardened layer). As a result, the gear is achieved with entire tooth portions having high strength. Furthermore, by performing the heating itself in the quenching process in a relatively long time at a relatively low temperature so as to make a deeper region than the second quench-hardened layer to be an unquenched layer, distortion is suppressed and fatigue strength is improved.

Therefore, the gear obtained by the present invention is reduced in the nonuniformity of hardness by the reduction in the structural nonuniformity, and provides excellent performance for cost.

BRIEF DESCRIPTION OF THE DRAWINGS

FIG. 2 is an enlarged view of a part of the gear of FIG. 1;

FIG. 6 shows a heat pattern of reduced-pressure carburizing treatment and reduced-pressure slow cooling treatment;

FIG. 7 shows a heat pattern of a quenching process;

DETAILED DESCRIPTION OF THE EMBODIMENT

Figure 1:
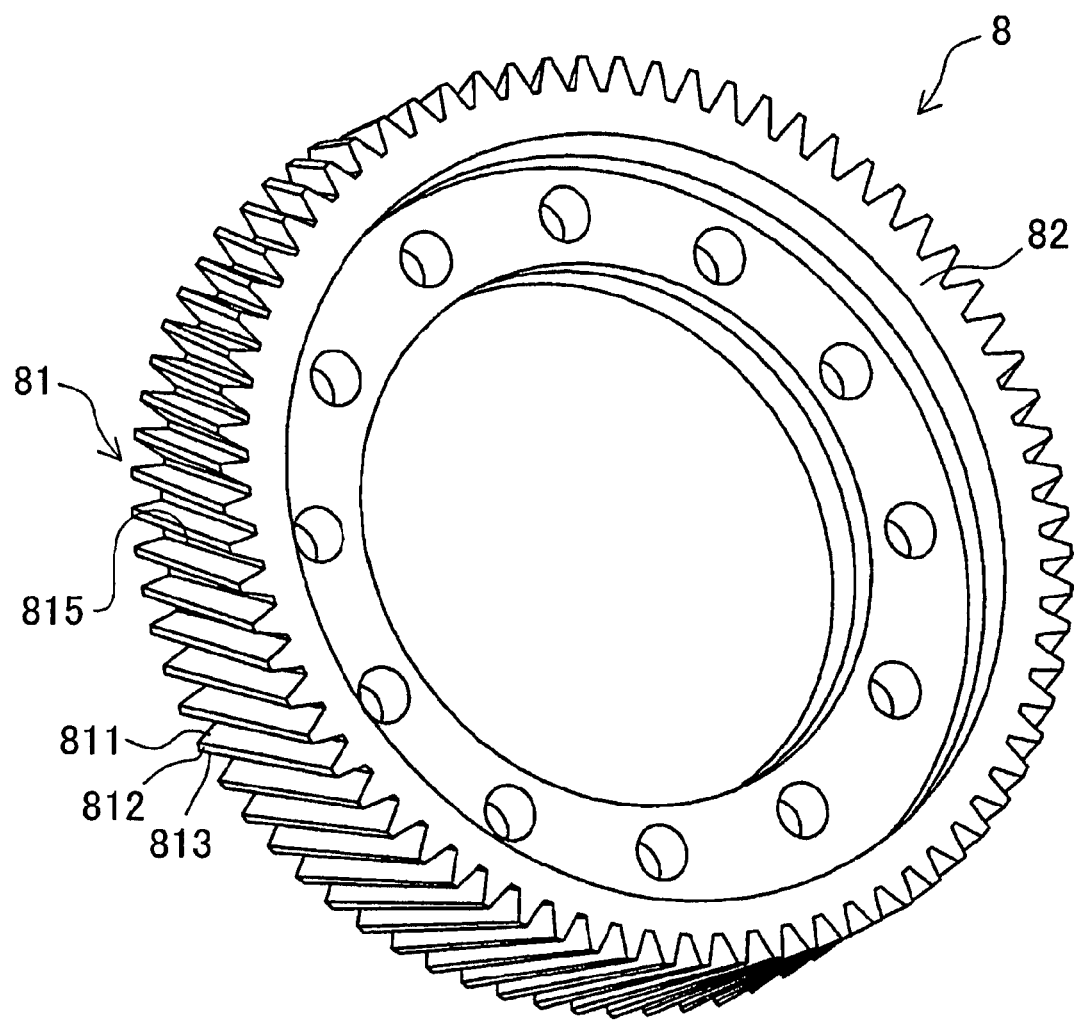
FIG. 1 is a perspective view showing an overall shape of a gear according to an embodiment.

First of all, description will be made of reasons for limiting the chemical composition of steel raw material used in the present invention. Hereinafter, the unit "% by mass" in a composition will be represented simply as "%".

C: 0.1% to 0.40%

C is an element that is added for ensuring strength, particularly strength in a deep layer portion, of the steel raw material. Therefore, in the present invention, the internal strength is ensured by setting the lower limit of additive concentration of C to 0.1%. However, if the additive concentration of C exceeds 0.40%, the following two disadvantages occur. One is that toughness is reduced while hardness is increased. The other is that the machinability of the steel raw material deteriorates. Therefore, the upper limit of additive concentration of C has been determined to be 0.40%. A more preferable range of the additive concentration is 0.15% to 0.3%.

Si: 0.35% to 3.0%

Si is an effective element not only for deoxidation in a steel-making process, but also for providing strength and hardenability necessary for the steel raw material as well as for improving the resistance to temper softening. The present invention is characterized by being capable of significantly reducing Cr and Mo that are expensive. However, in the case of parts required to be resistant to temper softening, such as a gear requiring pitting strength, it may be disadvantageous to reduce Cr and Mo to be less than those in Cr—Mo steel, which is a conventional steel type. Therefore, in order to obtain the required resistance to temper softening even when Cr and Mo are reduced, Si has been determined to be contained at a concentration of 0.35% or more. However, because this effect obtained by containing Si is saturated at a content of approximately 3.0%, no positive advantage is obtained by containing more Si. Not only that, an excess Si content of more than 3.0% deteriorates machinability of the raw material by bringing about an increase in the hardness thereof. Therefore, the Si content needs to be in a range of 0.35% to 3.0%. A more preferable range is from more than 0.45% to 1.5%.

In addition, if the steel raw material added with a large amount of Si is used in the case of using oxidizing atmosphere gas in a gas carburizing treatment, grain boundary oxidation occurs and an abnormal carburized layer is produced in a surface layer during the carburizing process. This is because Si is likely to form an oxide. Consequently, the strength of a carburized layer is reduced, leading to reduction in bending fatigue strength and contact pressure fatigue strength. On the other hand, the present invention employs a process in which the carburizing treatment is performed in a carburizing atmosphere in which the oxygen concentration is reduced by reducing pressure. As a result, the problem of the grain boundary oxidation is eliminated as will be described later. Therefore, the steel raw material with an actively increased Si content can be used.

Mn: 0.1% to 3.0%

Mn is an effective element not only for deoxidation in a steel-making process, but also for improving the hardenability. However, when the content of Mn is less than 0.1%, the effect thereof is insufficient. On the other hand, because the effect obtained by containing Mn is saturated at a content of approximately 3.0%, no positive advantage is obtained by containing more Mn. Not only that, an excess Mn content of more than 3.0% deteriorates machinability of the raw material by bringing about an increase in the hardness thereof. Therefore, the Mn content needs to be in a range of 0.1% to 3.0%. A more preferable range is from 0.5% to 1.5%.

P: 0.03% or less

P has an effect of reducing the toughness by being segregated at grain boundaries in the steel. Therefore, P needs to be reduced as much as possible, and needs to be limited to 0.03% or less, though hardly possible to be zero.

S: 0.15% or less

S forms MnS in the steel, and is therefore an element added for the purpose of improving machinability of the raw material by MnS. However, because this effect obtained by containing S is saturated at a content of approximately 0.15%, no positive advantage is obtained by containing more S. Not only that, an excess S content of more than 0.15% brings about grain boundary embrittlement by causing grain boundary segregation. Therefore, the S content needs to be 0.15% or less. Note that the machinability improvement effect is not significant if the S amount is less than 0.001%. Therefore, the lower limit, if to be specified, is set to 0.001% or more. A more preferable range is a range of 0.005% to 0.06%.

Al: 0.05% or less

Al is precipitated and dispersed as a nitride in the steel. This behavior makes Al to be an effective element for preventing an austenitic structure from coarsening during the carburizing treatment. However, an excess Al content of more than 0.05% coarsens the precipitate, thereby embrittling the steel. Therefore, the upper limit is set to 0.05%. Note that recrystallization occurs in a portion to which the high-density energy quenching treatment is applied so that the coarsened austenitic structure is made fine. Therefore, it is not essential to contain Al if high strength is required only in the portion to which the high-density energy quenching treatment is applied, but not required in regions not heated by high-density energy. However, if high strength is also required in the regions not heated by high-density energy, Al needs to be contained. In that case, the effect for prevention of coarsening of the austenitic structure is insufficient when the Al amount is less than 0.005%. Therefore, the lower limit, if to be specified, is set to 0.005% or more. A more preferable range is from 0.02% to 0.04%.

N: 0.03% or less

N has an effect of forming various nitrides so as to prevent the austenitic structure from coarsening during the carburizing treatment and during the high-density energy quenching treatment. However, an excess N content of more than 0.03% significantly worsens forgeability. Therefore, the upper limit is set to 0.03%. Note that, for the same reason as the reason described in the paragraph regarding Al, it is essential to contain N only when high strength is also required in the regions not heated by high-density energy. In that case, the effect for prevention of coarsening of the austenitic structure is insufficient when the N amount is less than 0.003%. Therefore, the lower limit, if to be specified, needs to be set to 0.003% or more. A more preferable range is from 0.005% to 0.02%.

Cr: less than 0.2%

Cr, when added at a concentration of less than 0.2%, is an effective element for improving the hardenability and the resistance to temper softening. However, if the additive concentration of Cr is 0.2% or more, Cr carbide is formed in a pearlite structure and a ferrite structure in the carburized layer during slow cooling after the carburizing treatment. This phenomenon significantly occurs particularly when the material has a hypoeutectoid composition with a C concentration of 0.5% to less than 0.8% during carburizing. The Cr carbide is dissolved in a matrix by performing the heating by high-density energy at a relatively high temperature (for example, at 950° C. or higher) after the slow cooling. Consequently, austenite transformation occurs uniformly during the high-frequency heating, and thus a uniform quenched structure is obtained. As a result, uniform hardness is also obtained. On the other hand, if the heating by high-density energy is performed at a relatively low temperature (for example, at lower than 950° C.) after the slow cooling, the Cr carbide is hardly dissolved in the matrix. Consequently, the austenite transformation occurs nonuniformly, causing the quenched structure to be also nonuniform. This phenomenon serves as a factor of occurrence of nonuniformity of hardness. Therefore, when the C concentration during the carburizing is in a range of 0.5% to less than 0.8%, it is preferable to suppress the Cr amount to a minimum necessary value so as to suppress the formation itself of the Cr carbide.

In addition, by limiting the Cr amount to the minimum necessary value, the Cr carbide easily dissolves in the matrix when a desired portion is heated by high-density energy into the austenite region during the quenching process. Therefore, the input energy during the high-density energy heating (integrated value of heating temperature during a period in which the temperature is at the transformation point or higher) can be reduced. As a result, energy saving and cost reduction can be achieved in the quenching process.

It is known that the formation of the Cr carbide can be suppressed by a considerable degree by achieving a chemical composition that satisfies the condition, $$[Si\%]+[Ni\%]+[Cu\%]-[Cr\%]>0.5$$

even if the content of Cr is 0.2% or more. However, satisfaction of this condition is not sufficient for suppressing the nonuniformity of hardness. A more preferable range of the Cr content is 0.1% or less. It should be noted that reduction in the content of Cr serves as a factor for reducing the hardenability and the resistance to temper softening. However, in the present invention, as described above, the hardenability and the resistance to temper softening are ensured by containing appropriate amounts of Si and Mn.

Mo: 0.1% or less

It is an object of the present invention to reduce Mo that is a relatively expensive metal among minor metals. However, Mo may be added if the added amount is extremely small. Mo is an effective element for improving the hardenability and the resistance to temper softening. However, containing of a large amount of Mo not only increases cost, but also serves as a factor of occurrence of nonuniformity of hardness for the same reason as in the case of Cr, though not so significantly as in the case of Cr. This is because Mo also forms a carbide during the slow cooling after the carburizing. Therefore, the upper limit needs to be set to 0.1%. If the hardenability and the resistance to temper softening that are necessary can be ensured by other elements, it is preferable to avoid adding Mo. In that case, it is advisable to set the upper limit to less than 0.01%, which represents the condition that Mo is not actively added. It should be noted that the reduction in the content of Mo also serves as a factor for reducing the hardenability and the resistance to temper softening in the same manner as in the case of Cr. However, in the present invention, as described above, this problem is dealt with by containing Si and Mn.

The steel raw material used in the present invention may further contain Ti: 0.005% to 0.2% and B: 0.0006% to 0.005%.

Ti: 0.005% to 0.2%

Ti is an element easily combined with N. Therefore, Ti has an effect of preventing B from forming BN, and thereby, from losing the hardenability improvement effect thereof. In addition, Ti is an effective element for preventing the austenitic structure from coarsening during the carburizing treatment and during an induction hardening treatment because Ti is precipitated and dispersed as a carbonitride in the steel. However, when the content of Ti is less than 0.005%, the effect thereof is not significant. On the other hand, an excess Ti content of more than 0.2% coarsens the precipitate, thereby embrittling the steel. Therefore, the upper limit has been determined to be 0.2%. The most preferable range of the content of Ti is from 0.01% to 0.03%.

B: 0.0006% to 0.005%

B, when being added, is an effective element for providing the hardenability and strengthening the grain boundaries. However, when the content of B is less than 0.0006%, the effect thereof is not significant. On the other hand, because this effect is saturated at a content of approximately 0.005%, no positive advantage is obtained by adding more B. Therefore, a preferable range is from 0.0006% to 0.005%. The most preferable range is from 0.001% to 0.003%.

The steel raw material used in the present invention may further contain either or both of Nb: 0.01% to 0.3% and V: 0.01% to 0.2%.

Nb: 0.01% to 0.3% and V: 0.01% to 0.2%

Nb and V are elements that are precipitated and dispersed as a carbonitride in the steel. Therefore, Nb and V are effective for preventing the austenitic structure from coarsening during the carburizing treatment and during the induction hardening treatment. However, when the content of each of Nb and V is less than 0.01%, the effect thereof is not significant. On the other hand, too large content coarsens the precipitate, thereby embrittling the steel. Therefore, the upper limits have been determined to be 0.3% for Nb and 0.2% for V. Most preferably, it is advisable to add Nb at a content in a range of 0.01% to 0.02%, and V at a content in a range of 0.01% to 0.05%.

The steel raw material used in the present invention can further contain Ni: 0.1% to 3.0%.

Ni: 0.1% to 3.0%

Ni is an effective element for improving the toughness. However, when the content of Ni is less than 0.1%, the effect thereof is not significant. On the other hand, because the effect is saturated at a content of approximately 3.0%, no positive advantage is obtained by adding more Ni. Not only that, an excess Ni content of more than 3.0% deteriorates machinability of the raw material by bringing about an increase in the hardness thereof. Therefore, the Ni content needs to be in a range of 0.1% to 3.0%. The most preferable range is from 0.5% to 1.5%.

As shown in FIG. 1, a gear 8 according to a present embodiment is provided with tooth portions 81 at even intervals on the circumferential edge of a circular disk portion 82. Note that, although the disk portion 82 shown in FIG. 1 is ring-shaped rather than disk-shaped, such a portion is also included in the term "disk". As shown in FIG. 2, each of the tooth portions 81 has a tooth wall surface 811 and a tooth top surface 812. A corner-shaped side between the tooth wall surface 811 and the tooth top surface 812 is referred to as a tooth tip corner portion 813. A tooth root portion 815 lies between the tooth portion 81 and the tooth portion 81.

The gear 8 of the present embodiment is applied, for example, to various gears in a vehicle drive train system. Gears of the vehicle drive train system are subjected to strict requirements such as low cost, high strength, and high shape accuracy. The present invention is very effective in satisfying those requirements. Gears in an automatic transmission and in a differential gear are examples of the gears of the vehicle drive train system.

Figure 3:
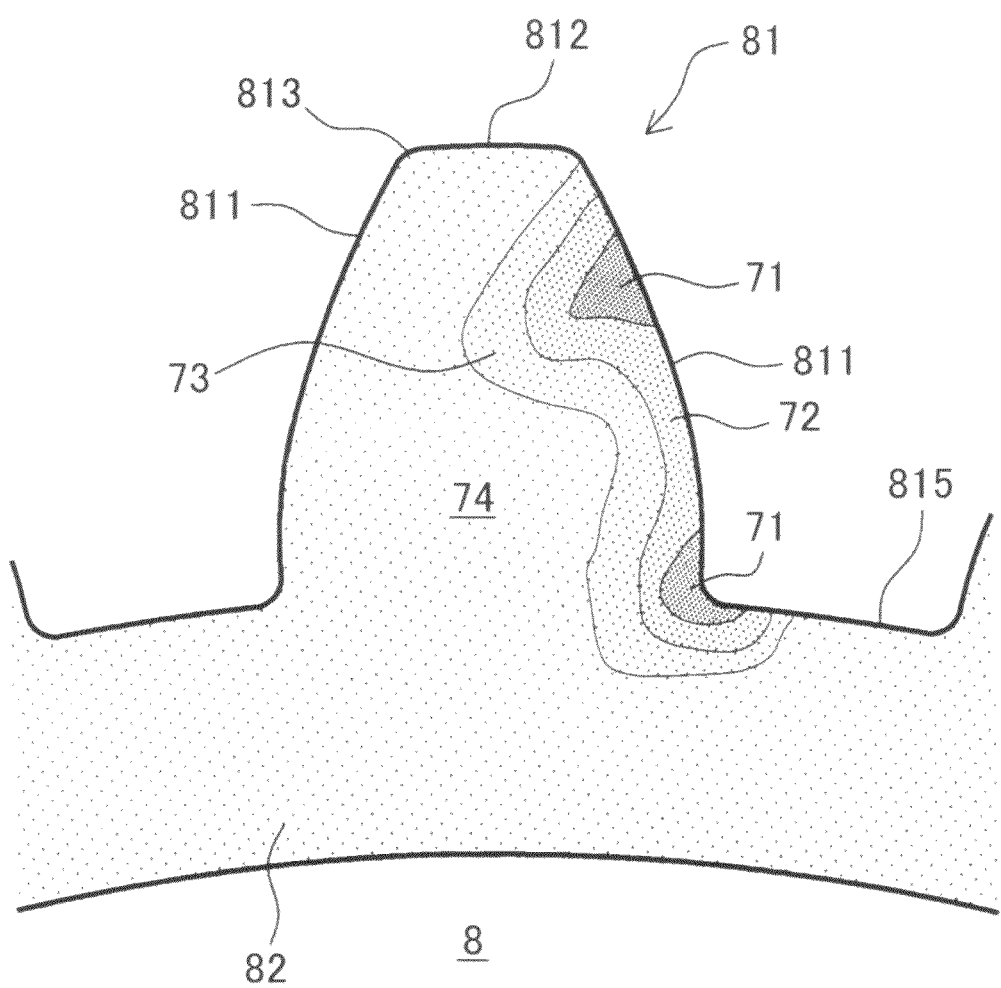
FIG. 3 is a cross-sectional view showing a stress distribution when the gear according to the embodiment is in use.

When the gear 8 is used for such applications as described above, a very large stress is applied to the tooth portions thereof. This phenomenon will be described according to FIG. 3. FIG. 3 shows a result of simulation of a stress distribution in a cross section of the gear 8 when in use. FIG. 3 shows a state in which a driving force is applied to the tooth wall surface 811 on the right side of the tooth portion 81. In FIG. 3, regions 71 are regions to which the largest stress is applied. The stress becomes smaller in regions 72, 73, and 74, in this order.

As is seen in FIG. 3, it is found that there are two places on which the stress concentrates when the gear is driven. One place is near the boundary between the tooth wall surface 811 and the tooth root portion 815. Mainly a bending stress is applied to this place. Another place is near a position in the tooth wall surface 811, the position being located where the distance from the tooth tip corner portion 813 is slightly smaller than the distance from the tooth root portion 815. Mainly a shear stress is applied to this place. In either of these two places, a large stress is applied not only to the vicinity of a surface layer of the gear 8, but also to a considerably deep portion. Even the regions 71 alone are deeper than the depth of a general carburized layer. Therefore, the gear 8 used for such applications as described above is required to have not only high surface hardness in the tooth portions 81, but also toughness inside the tooth portions 81.

The raw material of the gear 8 of the present embodiment is a hot-rolled steel product having the chemical composition within the above-specified range. This raw material is used as starting material, and roughly formed by hot forging. Then, anneal treatment is applied, and further, the tooth portions 81 are formed by cutting work. Through these processes, an outer shape of the gear 8 is completed. However, in addition to the above processes, the following treatment processes are further applied to the gear 8 of the present embodiment.

1. Carburizing Process

This is a process to apply treatment for forming the carburized layer in the surface layer portion of the gear 8 by heating the gear 8 in the carburizing atmosphere.

2. Cooling Process

This is a process to cool the gear 8 after the carburizing process. This cooling needs to be performed at least until the structural transformation by temperature drop after the carburizing is performed is completed.

3. Quenching Process

This is a process to locally heat the gear 8 after the cooling process into the austenite region by high-density energy, and after the heating, to rapidly cool and harden the gear 8.

The carburizing process described in "1" above will be further explained. First of all, the carburizing process is performed in carburizing gas under a pressure reduced to below the atmospheric pressure; that is, the process is a reduced-pressure carburizing process. In the reduced-pressure carburizing process, it is possible to perform the carburizing treatment with a relatively small amount of carburizing gas while maintaining in a reduced pressure state the inside of a carburizing furnace under a high temperature. Therefore, the carburizing treatment can be performed more efficiently than conventionally possible. In addition, there is no need to perform long-time heating treatment, as is required when a conventional large-size heat-treating furnace is used. Therefore, treatment time and energy consumption can be reduced, and furthermore, carburizing and quenching equipment itself can be downsized.

When the reduced-pressure carburizing process is applied, the present invention effectively exerts the effect of treating Cr as an optional component that is not actively added, and of limiting the upper limit value of Cr. In other words, because ordinary gas carburizing is performed through an equilibrium reaction, conditions can be set by calculating a carbon potential in advance. However, because the reduced-pressure carburizing treatment is a nonequilibrium reaction, it is difficult to set the conditions by such a calculation. In addition, when a steel member, such as a gear, having projected and depressed portions is processed by the reduced-pressure carburizing treatment, the rate of diffusion of carbon that has infiltrated differs depending on the portion. As a result, the obtained carbon concentration of the surface varies depending on the portion. In other words, nonuniformity of carburizing occurs. As a result, in some cases, a desired effect of modification is not obtained at a portion to be given a surface modification by the carburizing treatment.

If the Cr content of the raw material steel is large, the above-described formation of the Cr carbide can develop significantly in the case in which, as described above, a larger variation in degree of carburizing occurs than in the case of ordinary gas carburizing. In the present invention, because the Cr content is suppressed to be small, the formation of the Cr carbide as described above is suppressed. In this regard, the effect of limiting Cr is particularly effective because the reduced-pressure carburizing process is employed.

Because the reduced-pressure carburizing is employed, the pressure of the carburizing atmosphere during the carburizing process is lower than the atmospheric pressure. Accordingly, the oxygen concentration in the ambient atmosphere can be suppressed to be low. As a result, the grain boundary oxidation in the carburized layer can be prevented. Note that there is also a method for suppressing the amount of oxygen in the ambient atmosphere to be low by filling nitrogen gas or inert gas without reducing the pressure. The grain boundary oxidation in the carburized layer can also be prevented by such a method.

Note that the carburizing generally refers to treatment in which hydrocarbon-based gas (carburizing gas such as methane, propane, ethylene, or acetylene) is directly introduced into a furnace, and then steel material to be treated (here, the gear 8) is placed in the furnace atmosphere and heated so as to infiltrate carbon to the surface layer of the steel material to be treated, thereby forming a carburized layer. In this carburizing treatment, first, during a carburizing period, molecules of the carburizing gas contact the surface of the steel, and decompose to produce active carbon. This active carbon is supplied to the surface of the steel to form the carbide. As a result, the carbon is stored on the surface of the steel.

During the subsequent diffusion period, the carbide decomposes, and the stored carbon dissolves into the matrix. As a result, the carbon diffuses toward the inside to form the carburized layer. The infiltration route of the carbon is not limited to a route via the carbide, but there is also a route along which the active carbon directly dissolves into the matrix.

The ambient pressure during the reduced-pressure carburizing process is preferably in a range of 1 hPa to 100 hPa. If the ambient pressure during the reduced-pressure carburizing process is reduced to less than 1 hPa, expensive equipment is required to achieve and maintain an appropriate degree of vacuum. On the other hand, if the ambient pressure is a high pressure exceeding 100 hPa, soot is produced during the carburizing. As a result, a problem can occur in which the nonuniformity of carburizing occurs. The hydrocarbon-based gas such as acetylene, propane, butane, methane, ethylene, or ethane can be applied as the carburizing gas.

It is preferable to perform the carburizing process under the conditions under which the carbon concentration of the surface of the steel material after the diffusion period is 0.85% or less. In this way, the amount of carbon in the carburized layer is made to be equal to or less than that of eutectoid steel. Therefore, by effecting the austenite transformation by heating during the later quenching process, and then by performing the rapid cooling, the martensitic structure can be formed without precipitating cementite.

The gear of the present embodiment includes a first portion and a second portion with different diffusion rates of carbon having infiltrated during the carburizing treatment because of their shapes. The diffusion rate of carbon having infiltrated is lower in the second portion (difficult carbon diffusion portion) than in the first portion (easy carbon diffusion portion). It is preferable to perform the carburizing process under the conditions under which the carbon concentration of the surface of the first portion is in a range of 0.65%±0.1%. Here, in FIG. 3, the tooth wall surface 811, the tooth root portion 815, and the tooth top surface 812 (not including the tooth tip corner portion 813) correspond to the first portion, whereas the tooth tip corner portion 813 corresponds to the second portion.

As described above, the reduced-pressure carburizing treatment is a nonequilibrium reaction. Therefore, when the steel member, such as the gear 8, having projected and depressed portions is processed by the reduced-pressure carburizing treatment, the rate of diffusion of the carbon having infiltrated differs depending on the portion. Consequently, it has been found that the obtained carbon concentration of the surface varies depending on the portion, and that, in some cases, a desired effect of modification is not obtained at a portion to be given the surface modification by the carburizing treatment.

Note that, because the reduced-pressure carburizing treatment is a nonequilibrium reaction, the obtained carbon concentration of the surface differs between immediately after the carburizing period for carrying out the carburizing and after the diffusion period for carrying out the diffusion of the carbon that has infiltrated to the inside thereafter. The carbon concentrations of the carburized layer described above are represented by using the values obtained after the diffusion period without exception. Consequently, all of the carbon concentrations of the carburized layer in the present specification represent values of the carbon concentrations obtained not immediately after the carburizing period but after the diffusion period (the same applies hereinafter).

In view of such a situation, it has been found that the optimal conditions for the case in which the reduced-pressure carburizing process is applied to the gear 8 that has, because of the shape thereof, the first portion (easy carbon diffusion portion) and the second portion (difficult carbon diffusion portion) are conditions under which the carbon concentration of the surface of the first portion is in a range of 0.65%±0.1% as described above.

By performing the reduced-pressure carburizing treatment under the condition as described above, the inventor of the present invention has found for the first time as a result of many experiments that the obtained carbon concentration of the surface of the second portion, that is, the portion in which the rate of diffusion is lower than that of the first portion and the surface carbon concentration after the carburizing treatment is higher than that of the first portion, in the gear 8 can be suppressed in a range of less than 0.85%.

As a result, it is possible to limit within a range of 0.60% to 0.85% the carbon concentration of almost entire surface of the portion to be given the surface modification by the carburizing treatment of the gear 8. By limiting the surface carbon concentration in this range, and then, by further applying a special quenching process in which the gear 8 is rapidly cooled after being heated by using high-density energy, a quenching effect is sufficiently obtained even in the portion (first portion) in which the surface carbon concentration is near the lower limit, and a trouble caused by excessive carbon can be suppressed in the portion (second portion) in which the surface carbon concentration is near the upper limit. Thus, an excellent modified surface is obtained after the quenching.

When performing the reduced-pressure carburizing treatment under the carburizing conditions described above, it is necessary to adjust conditions such as temperature, type of carburizing gas, pressure, and treatment time in the reduced-pressure carburizing treatment process so that the carbon concentration of the surface of the first portion falls in the above-described particular range. For that purpose, it is desirable to find appropriate conditions by conducting a plurality of preliminary experiments with these conditions variously changed, and then, to perform the reduced-pressure carburizing treatment under the conditions thus found. Note that, if each gear 8 serving as a piece of material to be processed has the same shape, the times of the preliminary experiments can be reduced by accumulation of data. When determining the first portion and the second portion in the gear 8, it is possible to make a judgment by actually measuring carbon concentrations at a plurality of places in the preliminary experiments. The determination may be made by observing the shape because the judgment can be made relatively easily based on the shape.

Figure 4:
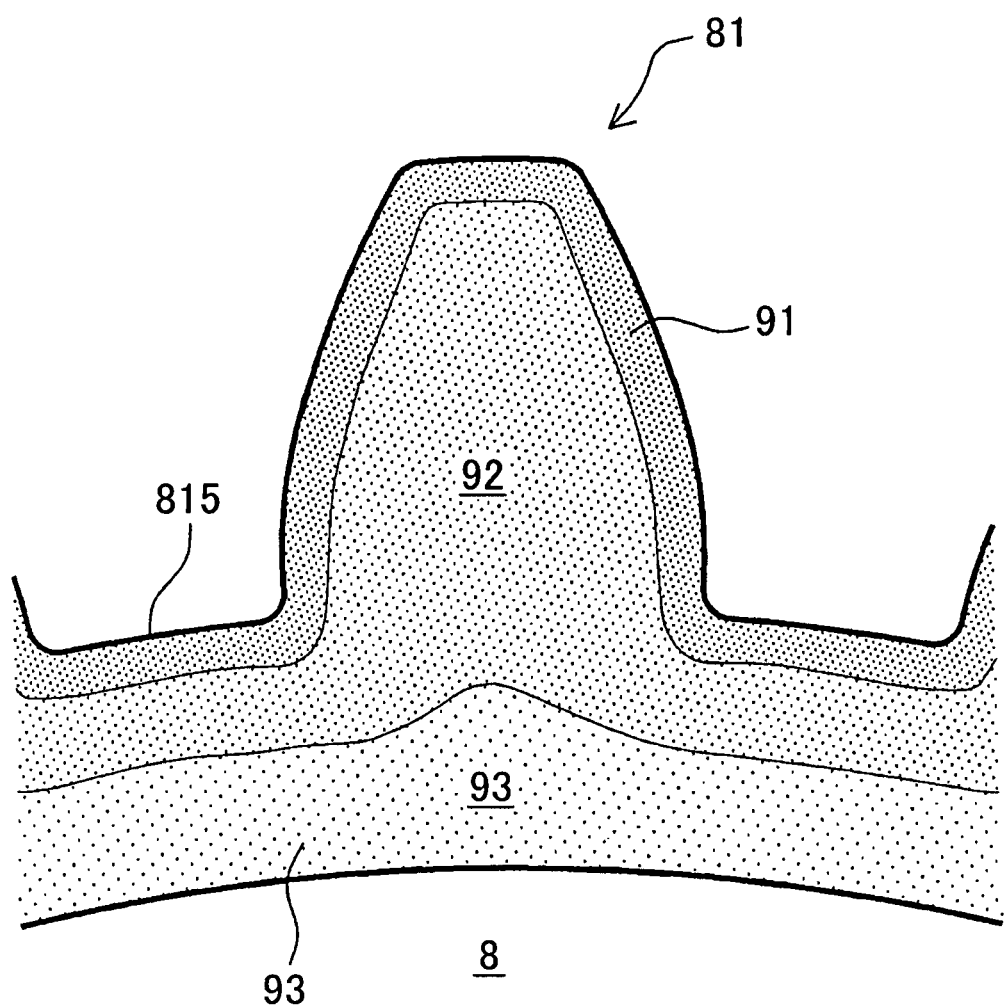
FIG. 4 is a cross-sectional view showing a distribution of a carburized layer and a quench-hardened layer in the gear according to the embodiment.

Through the carburizing process as described above, a carburized layer 91 shown in the cross-sectional view of FIG. 4 is formed in which the carbon concentration is higher than the carbon concentration of the steel. In other words, the carbon supplied to the surface of the steel infiltrates from the surface to the inside by diffusion, whereby the carburized layer 91 is formed in the surface layer portion. The carbon concentration in the carburized layer is made to be in a range of 0.60% to 0.85% on the surface as described above, and is gradually reduced toward the inside until reaching the carbon concentration of the raw material steel. The carburized layer 91 is formed in the surface layer of the tooth portion 81 and the tooth root portion 815. The thickness of the carburized layer 91 is approximately 0.7 to 1.3 mm. Note that FIG. 4 is drawn in such a manner that a quench-hardened layer 92 is present below the carburized layer 91. However, the quench-hardened layer 92 is formed after the completion of the quenching process to be described later. Therefore, the quench-hardened layer 92 has not yet been formed at this stage.

Next, the cooling process described in "2" above will be explained. The cooling process is performed under slow cooling conditions. More specifically, the gear 8 is cooled, at least at a lower cooling rate than a cooling rate at which the steel material of the gear 8 is transformed into martensite, to or below a temperature at which structural transformation by cooling is completed. As a result, distortion associated with the martensitic transformation can be prevented from occurring. Accordingly, the carburizing treatment can be completed with excellent shape accuracy.

Still more specifically, at least while the temperature of the gear 8 is at or above the A1 transformation point of the raw material steel thereof, it is preferable to cool the gear 8 at a cooling rate in a range of 0.1° C./s to 3.0° C./s. If the cooling rate exceeds 3.0° C./s before the temperature of the gear 8 drops below the A1 transformation point, a distortion occurrence suppression effect during the cooling may not be obtained sufficiently. On the other hand, if the cooling rate in the cooling process becomes lower than 0.1° C./s in the period in which the temperature of the steel member is at or above the A1 transformation point, the time required for the temperature to drop below the A1 transformation point results in being long. This result means that the carbon that has infiltrated into the carburized layer by the carburizing diffuses toward entire steel material during that time. Moreover, because the temperature during the cooling differs depending on the portion in the gear 8, the degree of diffusion also varies depending on the portion. As a result, the carbon concentration varies depending on the portion.

It is also preferable to perform the cooling process in a cooling atmosphere at a pressure reduced to less than the atmospheric pressure. In other words, the process is preferably a reduced-pressure cooling process. With this process, the distortion occurrence during the cooling can be further suppressed. The reason for this is that the heat exchange rate between the steel material and the ambient atmosphere can be reduced. Because of heat exchange between the steel material and the ambient atmosphere, the ambient temperature differs between the upstream side and the downstream side of the wind flow in the ambient atmosphere, and the ambient temperature in the downstream position is higher. When the pressure of the ambient atmosphere is as high as the atmospheric pressure, this temperature difference is significant because the heat exchange rate is high. Accordingly, temperature differences occur among portions in the gear 8, thereby producing a thermal distortion.

On the other hand, by employing the reduced-pressure cooling process, an essentially low heat exchange rate is obtained. As a result, the temperature difference is small between the upstream side and the downstream side of the wind, resulting in a progression of relatively uniform cooling. Accordingly, the thermal distortion is suppressed. Even in the case of cooling in a windless state, the thermal distortion is smaller in the reduced-pressure cooling than in the cooling at the atmospheric pressure. This is because only a small difference in the cooling rate is produced by stagnation of the cooling atmosphere of uneven temperature.

By such an effect of the reduced-pressure cooling process, the distortion during the cooling after the carburizing can be suppressed. As a result, it is possible to proceed to the next process, that is, the quenching process, while maintaining high dimensional accuracy. This effect is obtained in the highest degree by performing the cooling process at a reduced pressure and in a slowly cooling manner. In addition, the effect allows the gear 8 after the quenching to have high shape accuracy with little distortion in combination with the advantage achieved by performing the subsequent quenching process by the high-density energy heating.

If both of the carburizing process and the cooling process are performed under reduced pressures, the pressure difference between both processes is small. Consequently, in the actual equipment, both processes can be performed continuously by directly connecting a carburizing chamber to a slow cooling chamber. This means that an auxiliary chamber or the like for pressure adjustment need not be provided between both chambers. In other words, a product after completion of the reduced-pressure carburizing treatment can be subjected to the reduced-pressure slow cooling treatment without being exposed to the atmospheric pressure condition. This feature also contributes to the reduction in the distortion.

The ambient pressure in the cooling process is preferable to be specifically in a range of 100 hPa to 650 hPa. If the pressure during the cooling is higher than 650 hPa, the effect by pressure reduction is insufficient. On the other hand, it is difficult to reduce the pressure to lower than 100 hPa from the viewpoint of equipment structure. A more preferable range of the pressure during the cooling is from 100 hPa to 300 hPa.

Subsequently, the quenching process described in "3" above will be explained. It is important in the quenching process to partially heat a desired portion in the gear 8 to or above the austenitizing temperature, and during the subsequent rapid cooling, to transform at least the portion of the carburized layer into martensite. Therefore, the heating needs to be performed by the high-density energy heating. In addition, the rapid cooling needs to be performed at or above a critical cooling rate for the martensitic transformation. Examples of the high-density energy heating include heating by irradiation of a high-density energy beam such as an electron beam or a laser beam. The high-density energy heating also includes the high-frequency heating as an example other than the beam irradiation methods. Use of the high-density energy heating shortens a heating time. In the present embodiment, in combination with use of a low-Cr steel type that can be easily austenitized, the high-density energy heating can harden the gear 8 in a sure and sufficient manner.

The most preferable heating method for the high-density energy heating is the high-frequency heating. The high-frequency heating can accurately heat a desired portion with induction heating in a noncontact manner, as well as in a highly efficient manner. A known method can be used as a method of the high-frequency heating itself.

The rapid cooling in the quenching process is preferable to be performed by water cooling. In other words, because the heating before the rapid cooling has been performed by the high-density energy heating and not by any other method such as gas heating, quenching distortion hardly occurs even if the water cooling of a very high cooling rate is applied after the heating. This is because the high-density energy heating can accurately heat the gear 8 not entirely but partially. A high degree of quenching effect is obtained by the superior rapid cooling by water cooling. In other words, further high strength of a quenched portion is achieved. The high degree of quenching effect makes it possible to ensure required strength in some cases even if the carburizing treatment is simplified, that is, even if the carburizing time is shortened, or in other words, even if the carburized layer is thinned. In this case, the time for an entire heat treatment process can be further shortened.

When heating the gear 8 by the high-frequency heating, it is preferable to process the gear 8 one by one. In addition, when the gear 8 is cooled by water after heating, it is preferable to cool the gear 8 by spraying cooling water to the gear 8 from its periphery while rotating the gear 8. This makes it possible to rapidly cool the gear 8 in a uniform manner. As a result, the distortion is prevented from occurring during the rapid cooling.

The high-density energy heating in the quenching process is performed under the conditions under which the surface of the gear 8 is not melted, and a portion ranging from the surface to a relatively large depth is austenitized. This purpose can be achieved by supplying relatively small input energy for the high-density energy heating, and as a compensation therefor, by taking a slightly longer heating time (for example, approximately 15 to 25 seconds). In other words, the heating target temperature is set to a temperature in a relatively low temperature range (for example, 750° C. to 960° C.) of the austenite region of the steel raw material, and the heating is performed for a period of time slightly longer by a corresponding amount. This makes it possible to heat all of a slightly thick region with a depth exceeding 2 to 5 mm by heat conduction from the surface. As a result, the quenching effect can be provided not only to the region of the carburized layer but also to a region lying deeper than the carburized layer. Because the austenitizing by the high-density energy heating is achieved at a temperature confined in a relatively low range, there is also an effect that the distortion is suppressed during the water cooling after the heating.

Note that, when the heating is performed for a relatively long time at a relatively low temperature as described above, the nonuniformity of hardness may occur as described above unless the Cr content is limited within the range specified in the present invention. For this reason, also from the viewpoint of prevention of the nonuniformity of hardness, it is beneficial that the Cr content is limited to be low in the present invention.

In the present embodiment, the gear 8 serves as an object to be processed. When the object to be processed is an object, such as the gear 8, that has the projecting tooth portions 81, it is preferable to perform the high-density energy heating under the conditions under which all of the surface and the inside of the tooth portions 81 are austenitized. This is because the gear 8 is required to have both the high surface hardness of the tooth portions 81 and the high toughness of the inside thereof. In addition, the gear 8 is required to be such that the tooth portions 81 have the high shape accuracy. Therefore, as described above, it is effective to perform the heating in the quenching process for a relatively long time at a relatively low temperature. This is because the quenching effect is exerted not only on the portion of the carburized layer but also on the entire tooth portions 81, and also because the high shape accuracy is obtained by suppressing the distortion.

Thus, the quench-hardened layer 92 as shown in FIG. 4 is formed. In FIG. 4, the quench-hardened layer 92 lies below the carburized layer 91 in the surface layer of the gear 8. Particularly, the inside of the tooth portion 81 entirely serves as the quench-hardened layer 92. In addition, in the disk portion 82, a portion below the carburized layer 91 in the surface layer of the tooth root portion 815 and a portion below the tooth portion 81 serve as the quench-hardened layer 92. At a portion in the position of the tooth root portion 815, the total thickness of the carburized layer 91 and the quench-hardened layer 92 is approximately 2 to 5 mm. As described above, the quench-hardened layer 92 includes the martensitic structure. As a matter of course, the carburized layer 91 that is given the effect of quenching includes the martensitic structure. In the claims relating to the gear, the carburized layer 91 is referred to as a "first quench-hardened layer", and the quench-hardened layer 92 is referred to as a "second quench-hardened layer".

All of the regions indicated as the regions 71, 72, and 73 in FIG. 3 serve as the carburized layer 91 or the quench-hardened layer 92 in FIG. 4. In other words, the effect of quenching is exerted on all of the regions on which the stress concentrates when the gear is driven, and the hardness of the regions is increased. Thus, it is realized to have both the high surface hardness of the tooth portions 81 and the high toughness of the inside thereof.

An unquenched layer 93 lies below the quench-hardened layer 92. The unquenched layer 93 includes no martensitic structure. This is because the unquenched layer 93 is a portion in which the temperature has not increased to the austenitizing temperature during the heating in the quenching process. Note that, as described above, the C concentration of the surface in the carburized layer 91 is made to be in a range of 0.60% to 0.85% by the carburizing. The C concentration is gradually reduced toward the inside until reaching the original C concentration of the steel raw material. On the other hand, the C concentration of the quench-hardened layer 92 and the unquenched layer 93 coincides with the original C concentration of the steel raw material, which is in a range of 0.1% to 0.40%. In the claims relating to the manufacturing method of the gear, a portion to serve as the unquenched layer 93 is referred to as a "core portion".

As described above, the heat treatment including the carburizing process, the cooling process, and the quenching process of the present invention is a treating method that prevents the distortion from occurring. In other words, in the cooling process after the carburizing, the gear 8 is cooled at a lower cooling rate than the cooling rate at which the martensitic transformation occurs. As a result, in both of the carburized layer and the core portion lying deeper than the carburized layer, the martensitic structure is not formed, but any of a ferrite, a pearlite, or a bainite structure, or a mixed structure thereof is formed. Therefore, the cooling in the cooling process does not produce a martensitic transformation distortion, thus not deteriorating the shape accuracy of the gear 8.

In addition the high-density energy heating is used for heating in the quenching process after the cooling process. With this heating method, heating can be applied to only a region of a desired depth from the surface in a desired portion of the gear 8. In other words, heating can be applied to only a region of a very small volume relative to the entire volume of the gear 8. As a result, not the whole but a partial range of the gear 8 is transformed into martensite during the rapid cooling after the heating. Consequently, the martensitic transformation distortion is reduced, resulting in the high shape accuracy after the quenching.

EXAMPLE

Specific description will be made below of the gear and the manufacturing method thereof in an example according to the present invention and comparative examples thereof. These invention examples are provided for the purpose of explaining the present invention, and do not limit the scope of the present invention.

TABLE 1

| | Test No. | Chemical Composition (% by mass) | | | | | | | | |
|---|---|---|---|---|---|---|---|---|---|---|
| | | C | Si | Mn | Cr | P | S | Al | N | Ti, B, Nb, V, Ni, Mo |
| Invention Example | 1 | 0.25 | 0.65 | 1.25 | 0.11 | 0.013 | 0.019 | 0.032 | 0.0054 | — |
| | 2 | 0.36 | 0.51 | 1.59 | 0.09 | 0.017 | 0.016 | 0.031 | 0.0125 | — |
| | 3 | 0.21 | 0.81 | 0.81 | 0.12 | 0.015 | 0.012 | 0.032 | 0.0038 | 0.015 (Ti), 0.0019 (B) |
| | 4 | 0.15 | 0.75 | 1.00 | 0.12 | 0.016 | 0.016 | 0.013 | 0.0038 | 0.031 (Ti), 0.0031 (B) |
| | 5 | 0.10 | 0.81 | 0.82 | 0.11 | 0.015 | 0.001 | 0.033 | 0.0038 | — |
| | 6 | 0.40 | 0.81 | 0.83 | 0.03 | 0.014 | 0.015 | 0.033 | 0.0040 | 0.030 (Ti), 0.0019 (B) |
| | 7 | 0.35 | 0.36 | 0.60 | 0.10 | 0.015 | 0.055 | 0.029 | 0.0040 | — |
| | 8 | 0.20 | 2.98 | 0.91 | 0.10 | 0.014 | 0.005 | 0.031 | 0.0041 | — |
| | 9 | 0.21 | 0.81 | 0.10 | 0.05 | 0.015 | 0.015 | 0.031 | 0.0040 | — |
| | 10 | 0.20 | 0.80 | 2.99 | 0.10 | 0.015 | 0.149 | 0.030 | 0.0038 | — |
| | 11 | 0.38 | 1.49 | 0.83 | — | 0.015 | 0.015 | 0.030 | 0.0037 | — |
| | 12 | 0.20 | 0.51 | 1.10 | 0.19 | 0.015 | 0.011 | 0.033 | 0.0040 | — |
| | 13 | 0.20 | 0.80 | 0.82 | 0.11 | 0.030 | 0.015 | 0.033 | 0.0041 | — |
| | 14 | 0.19 | 0.50 | 1.49 | 0.10 | 0.015 | 0.014 | 0.005 | 0.0041 | — |
| | 15 | 0.30 | 0.80 | 0.82 | 0.10 | 0.015 | 0.014 | 0.049 | 0.0040 | — |
| | 16 | 0.20 | 1.30 | 1.20 | 0.10 | 0.014 | 0.014 | 0.030 | 0.0038 | 0.005 (Ti), 0.0006 (B) |

TABLE 1-continued

| Test | Chemical Composition (% by mass) | | | | | | | | |
|---|---|---|---|---|---|---|---|---|---|
| No. | C | Si | Mn | Cr | P | S | Al | N | Ti, B, Nb, V, Ni, Mo |
| 17 | 0.19 | 0.45 | 0.82 | 0.07 | 0.015 | 0.008 | 0.032 | 0.0042 | 0.190 (Ti), 0.0049 (B) |
| 18 | 0.20 | 0.80 | 0.81 | 0.10 | 0.015 | 0.009 | 0.029 | 0.0031 | — |
| 19 | 0.37 | 0.80 | 0.83 | 0.10 | 0.014 | 0.015 | 0.034 | 0.0296 | — |
| 20 | 0.19 | 0.91 | 0.81 | 0.11 | 0.015 | 0.014 | 0.030 | 0.0040 | 0.015 (Nb) |
| 21 | 0.20 | 0.81 | 1.21 | 0.10 | 0.016 | 0.015 | 0.031 | 0.0041 | 0.04 (V) |
| 22 | 0.20 | 0.37 | 0.83 | 0.10 | 0.015 | 0.014 | 0.030 | 0.0040 | 1.01 (Ni) |
| 23 | 0.20 | 0.80 | 0.71 | 0.10 | 0.014 | 0.015 | 0.033 | 0.0037 | 0.06 (Mo) |

TABLE 2

| | Test | Chemical Composition (% by mass) | | | | | | | | |
|---|---|---|---|---|---|---|---|---|---|---|
| | No. | C | Si | Mn | Cr | P | S | Al | N | Ti, B, Nb, V, Ni, Mo |
| Comparative Example | 24 | 0.21 | *0.30* | 0.79 | 0.10 | 0.015 | 0.014 | 0.030 | 0.0056 | 0.015 (Ti), 0.0021 (B) |
| | 25 | *0.41* | 0.79 | 0.83 | 0.10 | 0.015 | 0.060 | 0.033 | 0.0039 | — |
| | 26 | 0.20 | 0.50 | 0.83 | *0.30* | 0.015 | 0.015 | 0.030 | 0.0041 | — |
| | 27 | 0.21 | 0.91 | 0.66 | *0.23* | 0.016 | 0.019 | 0.030 | 0.0120 | — |
| | 28 | 0.30 | 0.80 | 0.82 | *1.05* | 0.015 | 0.015 | 0.029 | 0.0043 | 0.015 (Ti), 0.0015 (B) |
| | 29 | 0.20 | 0.79 | 1.10 | 0.10 | *0.032* | 0.015 | 0.032 | 0.0039 | — |
| | 30 | 0.32 | 1.29 | 0.60 | 0.08 | 0.013 | *0.161* | 0.033 | 0.0045 | — |
| | 31 | 0.20 | *0.25* | 0.81 | *1.10* | 0.015 | 0.015 | 0.033 | 0.0081 | *0.15* (Mo) |
| | 32 | 0.21 | 0.34 | 0.79 | *1.10* | 0.015 | 0.014 | 0.031 | 0.0078 | *0.15* (Mo) |

In the present example, hot-rolled steel products having chemical compositions shown in Table 1 (invention examples, Test Nos. 1 to 23) and Table 2 (comparative examples, Test Nos. 24 to 32) were used as raw material to produce the gear 8 (differential ring gear) by machining. This machining was used as a test (cutting test) for judging the machinability of steel raw material. The chemical composition of each raw material type of the comparative examples of Table 2 is outside of the scope of the present invention at each data point indicated in bold italic characters, as described below.

In Test No. 24, Si is deficient.
In Test No. 25, C is excessive.
In Test Nos. 26 to 28, Cr is excessive.
In Test No. 29, P is excessive.
In Test No. 30, S is excessive.
In Test No. 31, Si is deficient, and Cr and Mo are excessive.
In Test No. 32, Cr and Mo are excessive.

Among the above-described comparative examples, Test Nos. 31 and 32 are examples in which a conventional steel type, JIS-SCM420 (chromium-molybdenum steel), was used as raw material.

Subsequently, the carburizing process, then the cooling process, and then the quenching process were applied to the gear 8 after the machining process. The gear 8 after these processes was subjected to material quality examination and fatigue test.

Figure 5:
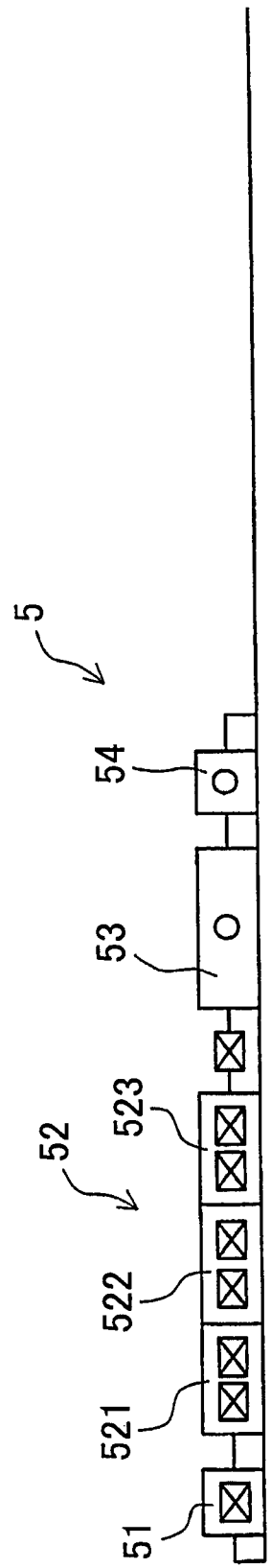
FIG. 5 is an explanatory diagram showing a structure of heat treatment equipment used in an example.

Here, in the present example, brief description will be made of heat treatment equipment that was used for performing a process sequence from the carburizing process to the quenching process. As shown in FIG. 5, the heat treatment equipment 5 used in the present example has a pre-cleaning bath 51, a reduced-pressure carburizing slow cooling apparatus 52, an induction hardening machine 53, and a magnetic flaw detection apparatus 54. The pre-cleaning bath 51 is a section in which the gear 8 is cleaned before the heat treatment is started. The reduced-pressure carburizing slow cooling apparatus 52 is provided with a heating chamber 521, a reduced-pressure carburizing chamber 522, and a reduced-pressure slow cooling chamber 523. The gear 8 is increased in temperature in the heating chamber 521. Then, the reduced-pressure carburizing is applied in the reduced-pressure carburizing chamber 522, and the reduced-pressure slow cooling is applied in the reduced-pressure slow cooling chamber 523. No auxiliary chamber is provided between the reduced-pressure carburizing chamber 522 and the reduced-pressure slow cooling chamber 523. The induction hardening machine 53 is a section in which the high-frequency heating and the subsequent water cooling are applied to the gear 8 after the reduced-pressure slow cooling. The magnetic flaw detection apparatus 54 is a section in which a defect inspection is applied to the gear 8 after the quenching.

Subsequently, description will be made of the processes that were performed in the heat treatment equipment 5 shown in FIG. 5. First, description will be made of the reduced-pressure carburizing process performed in the reduced-pressure carburizing chamber 522 of the reduced-pressure carburizing slow cooling apparatus 52. As described above, the carburizing treatment in the present example is the reduced-pressure carburizing treatment that is performed in the carburizing gas at a pressure reduced to less than the atmospheric pressure. FIG. 6 shows a heat pattern in the reduced-pressure carburizing treatment and the subsequent reduced-pressure slow cooling treatment. In FIG. 6, the horizontal axis represents the time, and the vertical axis represents the temperature.

In FIG. 6, the symbol "a" represents a heating period in the heating chamber 521. The symbols "b1" and "b2" represent holding periods in the reduced-pressure carburizing chamber 522. An earlier period "b1" of the holding periods corresponds to the carburizing period in the carburizing treatment, and a subsequent later period "b2" corresponds to the diffusion period in the carburizing treatment. In the present example, a carburizing temperature, that is, a holding temperature in the holding periods "b1" and "b2" was set to 950° C. that is a temperature at or above the austenitizing temperature of the steel raw material. The temperature of the gear 8 was increased to the holding temperature in the heating period "a". The temperature of the gear 8 was maintained to be a constant temperature, that is, the holding temperature, during the holding periods "b1" and "b2".

In the present example, the pressure of the carburizing gas in the reduced-pressure carburizing treatment was set to be in a range of 1 hPa to 3.5. Acetylene was used as the carburizing gas in the carburizing period "b1". The carburizing conditions were determined as follows through the preliminary experiments conducted in advance. Specifically, the gear 8 of the present example is a differential ring gear, and, because of the shape thereof, has the first portion (easy carbon diffusion portion) and the second portion (difficult carbon diffusion portion). In the gear 8, as shown in FIG. 2, the tooth root portion 815 and the tooth wall surface 811 correspond to the first portion, and the tooth tip corner portion 813 corresponds to the second portion. In the present example, conditions were employed under which the carbon concentration of the surface layer of the tooth root portion 815 corresponding to the first portion is in a range of 0.65%±0.05%.

Subsequently, description will be made of the reduced-pressure slow cooling process performed in the reduced-pressure slow cooling chamber 523 subsequent to the reduced-pressure carburizing treatment. As described above, the slow cooling treatment in the present example is the reduced-pressure slow cooling treatment that is performed in an atmosphere at a pressure reduced to less than the atmospheric pressure. In FIG. 6, a period represented by "c" is a slow cooling period. In the present example, the ambient pressure in the reduced-pressure slow cooling treatment was set to 600 hPa. The type of the atmosphere gas is $N_2$ gas. The cooling rate in the reduced-pressure slow cooling treatment was set to be in a range of 0.1° C./s to 3.0° C./s. The cooling was performed at this cooling rate until the temperature drops from a temperature at or above the austenitizing temperature immediately after the carburizing treatment to 150° C. that is lower than the A1 transformation point. Note that the heat pattern shown in FIG. 6 is an example, and can be changed, by conducting appropriate preliminary tests, to a heat pattern of optimal conditions for the type of steel raw material used.

Subsequently, description will be made of the quenching process performed in the induction hardening machine 53. In the quenching process of the present example, the high-frequency heating was used as a unit to perform high-density energy heating. The water cooling was used as a rapid cooling unit. FIG. 7 shows a heat pattern of the quenching process of the present example. In FIG. 7, in the same manner as in FIG. 6, the horizontal axis represents the time, and the vertical axis represents the temperature. In FIG. 7, the symbol "d1" represents a temperature rising period, and the symbol "d2" represents a rapid cooling period. In the temperature rising period "d1", the high-frequency heating heats the tooth portions 81 on the outer circumferential side of the gear 8 to a temperature at or above the austenitizing temperature. In the subsequent rapid cooling period "d2", the spraying of water rapidly cools the gear 8 so that the cooling rate of the carburized layer thereof is equal to or higher than the critical cooling rate. As described above, the critical cooling rate refers to a cooling rate required for transforming into martensite the austenitized steel raw material, particularly the carburized layer portion thereof.

Figure 8:
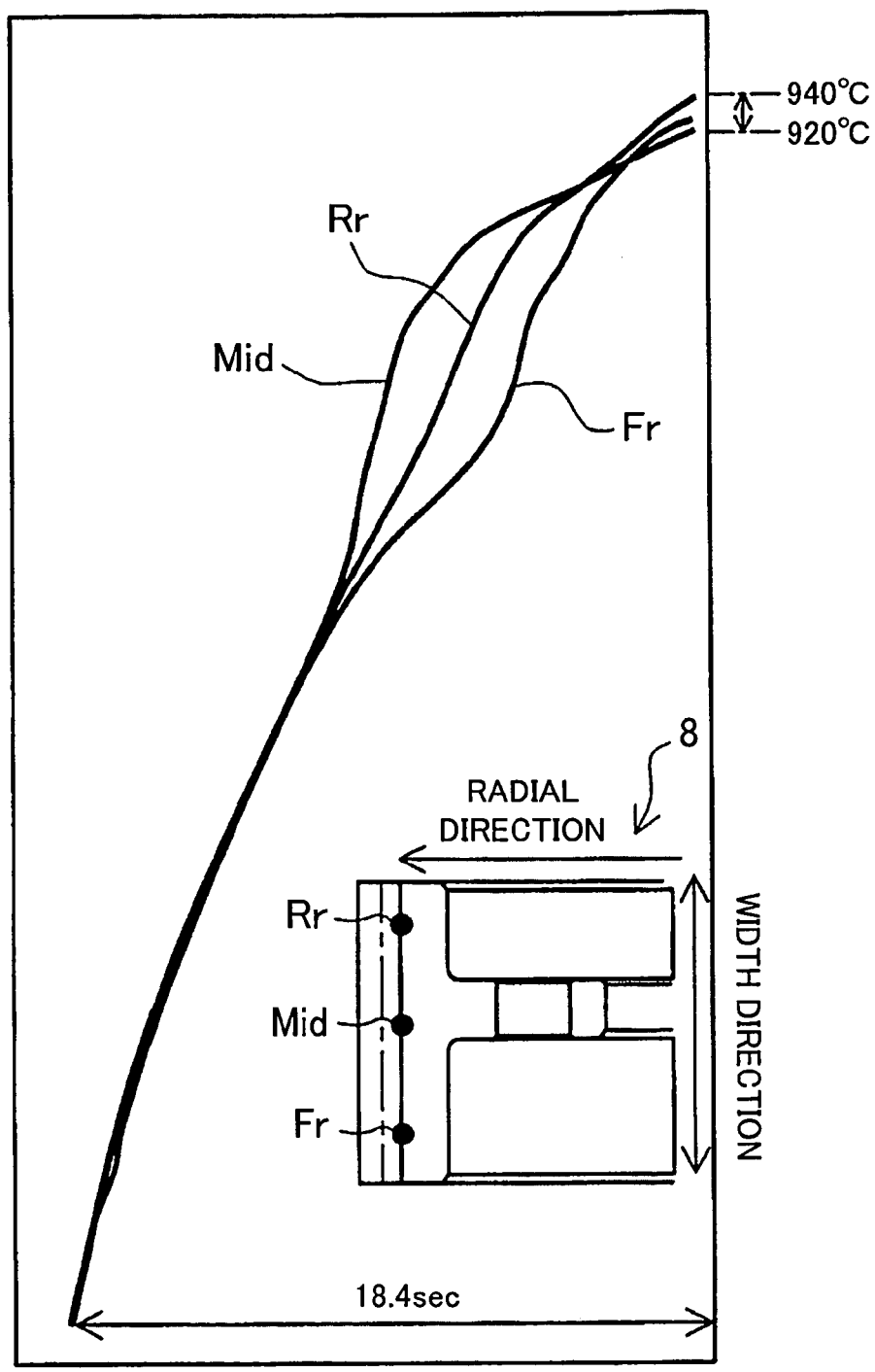
FIG. 8 is a temperature rise chart during a temperature rising period of the quenching process.

In the high-frequency heating during the temperature rising period "d1", the amount of input energy was set to be smaller than an amount given under conditions for ordinary high-frequency heating, and the heating time was made relatively longer by a corresponding amount to be 15 to 25 seconds. In this way, the whole of the tooth portions 81 including not only the surface and the vicinity thereof but also the inside was heated to be in a range of 750° C. to 960° C. The attained temperature on the surface of the tooth root portion 815 was in a range of 920° C. to 940° C. FIG. 8 is a temperature rise chart showing actual temperatures on the surface of the tooth root portion 815 during the temperature rising period "d1". FIG. 8 shows measurement results at three portions of a first end portion Rr, a middle portion Mid, and a second end portion Fr located with respect to the width direction of the gear 8. It is found that the temperatures of all of the three portions increased into a range of 920° C. to 940° C. even in the period of 15 to 25 seconds after the temperature rise had started. Note that the temperature rising rates are found to vary depending on the position in the width direction while the temperatures are still rising. This phenomenon is considered to occur because of positional relationships relative to heating coils during heating. However, there is no large difference in the time to the end of the temperature rise and in the attained temperature.

Figure 9:
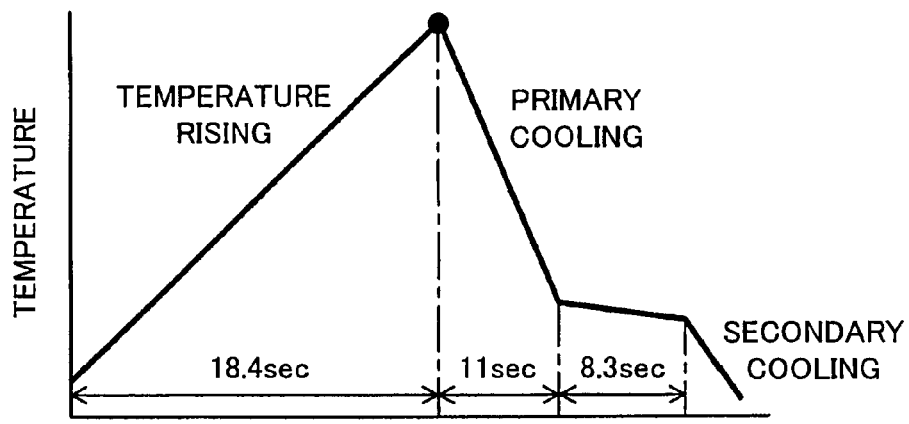
FIG. 9 is another example of the heat pattern of the quenching process.

The high-frequency heating was individually applied to the gears 8 one by one while carrying the gears 8 (conveying the gears 8) one by one. The water cooling in the rapid cooling period "d2" was completed in approximately 13 seconds. The cooling rate during that period was 50° C./s to 65° C./s. During the water cooling, the gear 8 was rotated, and the cooling water was sprayed to the gear 8 from its periphery, thus individually cooling the gears 8 one by one. In this way, the quenching process was performed by the method that can suppress the occurrence of distortion most effectively. The heat pattern shown in FIG. 7 is also an example, and can be changed, by conducting appropriate preliminary tests, to a heat pattern of optimal conditions for the type of steel raw material used. For example, as shown in FIG. 9, the cooling after the temperature rise may be performed in two stages.

Next, description will be made of tests that were conducted on the gear 8. In the present example, the following three types of tests were conducted on the gear 8: machinability test, material quality examination, and fatigue test.

<Machinability Test>

As described above, the machinability tests were conducted when the gears 8 were produced from hot-rolled steel products by machining. The conditions of the machinability tests were as follows: lathe is performed in the dry environment by using a carbide tool at a circumferential speed of 250 m/min, a feed rate of 0.3 mm/rev, and a depth of cut of 1.5 mm. Under these conditions, ten of the gears 8 were produced. A case in which the carbide tool was not chipped was judged as "good", whereas a case in which the carbide tool was chipped was judged as "poor".

<Material Quality Examination>

The material quality examination was conducted on a sample taken from the tooth wall surface 811 of the gear 8 that had not been subjected to the fatigue test to be described later after the completion of the heat treatment. The following two items were investigated: hardness and crystal grain size. Regarding the hardness, the Vickers hardness at a load of 2.9 N was measured at each of depths increased at intervals of 0.05 mm from the surface of the sample, and an effective depth of the hardened layer specified in JIS G 0557 was measured. Regarding the crystal grain size, at a depth of 0.4 mm from the surface of the sample, an austenitic grain size number specified in JIS G 0551 was obtained and evaluated.

The evaluation of material quality was judged based on the following criteria.

(Good)

The material satisfying all of the following three conditions was judged as "good".

An effective depth of the hardened layer of 0.8 mm or more is ensured.

No nonuniformity is present in Vickers hardness. Specifically, the difference is less than HV50 between every adjacent pair of measurement points.

Fine grain having an austenitic grain size number of 6 or more.

(Poor)

The material not satisfying any of the above three conditions was judged as "poor", and the unsatisfactory condition was identified. Note that, if the material turned out to have very low strength in the fatigue test to be described later, the fracture surface thereof was observed with a SEM (scanning electron microscope) to check whether the fracture surface was formed by grain boundary brittle fracture.

<Fatigue Test>

As fatigue tests, tooth root bending fatigue strength (Nm) and pitting strength (Nm) were measured by a power circulating type gear tester. The gears 8 tested had the following dimensions: a module of 2.03, a pressure angle of 18°, and a helix angle of 27°. The tooth root bending fatigue strength was evaluated by the amount of input torque that provided a fatigue life of 10 million cycles under the condition that a lubricating oil temperature was 80° C. and a rotating speed was 2000 rpm. When the pitting area was 3% or less of the entire tooth bearing area after 50 million cycles of input torque had been applied under the condition that a lubricating oil temperature was 120° C. and a rotating speed was 4000 rpm, the pitting strength was evaluated by the amount of the input torque thus applied. In both of the tests, ATF (automatic transmission fluid) was used as lubricating oil.

TABLE 3

|  | Test No. | Machinability Test Result | Material Quality Examination Result | Fatigue Test Result (Input Torque in Nm) | |
|---|---|---|---|---|---|
|  |  |  |  | Tooth Root Bending Fatigue | Pitting |
| Invention Example | 1 | Good | Good | 406 | 270 |
|  | 2 | Good | Good | 400 | 253 |
|  | 3 | Good | Good | 418 | 282 |
|  | 4 | Good | Good | 406 | 276 |
|  | 5 | Good | Good | 424 | 288 |
|  | 6 | Good | Good | 419 | 290 |
|  | 7 | Good | Good | 406 | 206 |
|  | 8 | Good | Good | 365 | 300 |
|  | 9 | Good | Good | 383 | 276 |
|  | 10 | Good | Good | 412 | 288 |
|  | 11 | Good | Good | 365 | 306 |
|  | 12 | Good | Good | 394 | 222 |
|  | 13 | Good | Good | 377 | 282 |
|  | 14 | Good | Good | 406 | 259 |
|  | 15 | Good | Good | 412 | 282 |
|  | 16 | Good | Good | 371 | 306 |
|  | 17 | Good | Good | 377 | 247 |
|  | 18 | Good | Good | 418 | 282 |
|  | 19 | Good | Good | 406 | 270 |
|  | 20 | Good | Good | 371 | 282 |
|  | 21 | Good | Good | 388 | 300 |
|  | 22 | Good | Good | 377 | 211 |
|  | 23 | Good | Good | 418 | 276 |

TABLE 4

|  | Test No. | Machinability Test Result | Material Quality Examination Result | Fatigue Test Result (Input Torque in Nm) | |
|---|---|---|---|---|---|
|  |  |  |  | Tooth Root Bending Fatigue | Pitting |
| Comparative Example | 24 | Good | Good | 412 | 194 |
|  | 25 | Poor machinability | - (Impossible to make gear) | | |
|  | 26 | Good | Nonuniform hardness | 330 | 194 |
|  | 27 | Good | Nonuniform hardness | 325 | 188 |
|  | 28 | Good | Nonuniform hardness | 324 | 188 |
|  | 29 | Good | Grain boundary brittle fracture surface | 294 | 164 |
|  | 30 | Good | Grain boundary brittle fracture surface | 303 | 165 |
|  | 31 | Good | Nonuniform hardness | 342 | 200 |
|  | 32 | Good | Nonuniform hardness | 340 | 205 |

Table 3 (invention examples) and Table 4 (comparative examples) show results of the tests described above. As shown in Table 3, the machinability and the material quality of all of the gears 8 (Test Nos. 1 to 23) of the present invention were found to be good. The fatigue tests also showed excellent results. Particularly, in all of the invention examples, the tooth root fatigue strength was superior to that of the comparative examples, Test Nos. 31 and 32, that used conventional steel SCM420, and the pitting strength was comparable with or superior to that of the comparative examples, Test Nos. 31 and 32.

Figure 10:
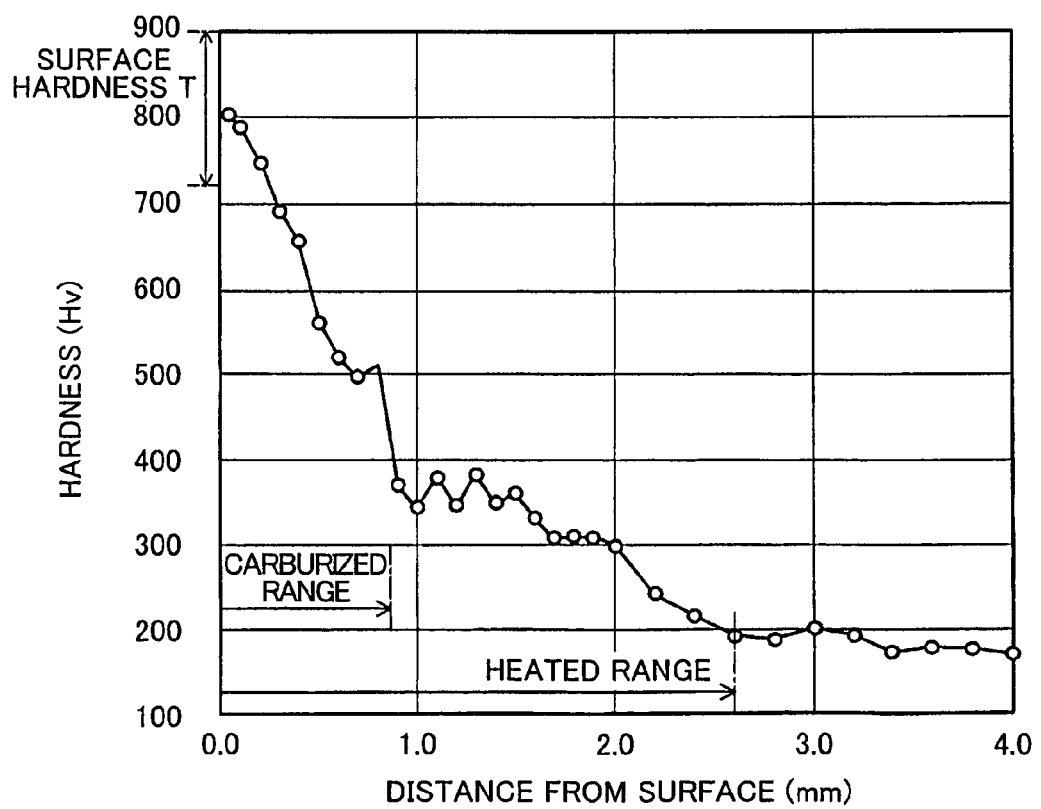
FIG. 10 is a graph showing a relation between hardness and depth after the quenching process.

FIG. 10 shows details of measurement results of the Vickers hardness of one of the invention examples, Test No. 3. In FIG. 10, the vertical axis represents the Vickers hardness, and the horizontal axis represents the depth from the surface (tooth root portion 815). According to FIG. 10, the Vickers hardness is approximately 800 on the surface, and is reduced as the depth increases. Then, the Vickers hardness remains almost constant at a depth of 2.6 mm or more. From this result, it is found, in this example, that the effect of the quenching is exerted on a portion extending from the surface to a depth of 2.6 mm, and that a portion at a depth of 2.6 mm or more is the unquenched layer 93. In addition, in the range from the surface to a depth of 2.6 mm, there is a stepwise change in the Vickers hardness at a depth of approximately 0.9 mm. From this result, it is found, in this example, that the range from the surface to a depth of 0.9 mm is the carburized layer 91, and the range from a depth of 0.9 mm to a depth of 2.6 mm is the quench-hardened layer 92. In this way, in the present invention example, the hardness is increased by the quenching not only in the carburized layer 91, but also in the quench-hardened layer 92 therebelow.

In contrast, in the comparative examples, poor results were found in all of Test Nos. 24 to 32. Table 4 shows the poor results in bold italic characters. The individual results are as follows.

In Test No. 24, the pitting strength was low. The reason is considered to be that the resistance to temper softening was increased insufficiently because the Si amount in the steel raw material was less than 0.35%.

In Test No. 25, the gear 8 serving as a test piece could not be produced because of poor machinability of the raw material. The reason is considered to be that the raw material was too hard because the C amount in the steel raw material exceeded 0.40%.

In each of Test Nos. 26 to 28, the hardness was nonuniform, and the fatigue strengths (both the tooth root strength and the pitting strength) were low. The reason is considered to be that lack of penetration of cementite occurred because the Cr amount in the steel raw material exceeded 0.2%.

In Test No. 29, the fatigue strengths (both the tooth root strength and the pitting strength) were very low. Consequently, the fracture surface was observed by the SEM and confirmed to be a grain boundary brittle fracture surface. The reason of the low fatigue strengths is considered to be that a grain boundary segregation of P occurred to cause grain boundary brittleness because the P amount in the steel raw material exceeded 0.03%.

In Test No. 30, the fatigue strengths (both the tooth root strength and the pitting strength) were very low. Consequently, the fracture surface was observed by the SEM and confirmed to be a grain boundary brittle fracture surface. The reason of the low fatigue strengths is considered to be that a grain boundary segregation of S occurred to cause grain boundary brittleness because the S amount in the steel raw material exceeded 0.15%.

In Test Nos. 31 and 32, the hardness was nonuniform, and the tooth root fatigue strength was low. These comparative examples used the conventional steel SCM420 (chromium-molybdenum steel). The reason of the low fatigue strength is considered to be that lack of penetration of cementite occurred because both of the Cr amount and the Mo amount were excessive. Particularly, the pitting strength was also slightly low in Test No. 31. The reason is considered to be that the Si amount in the steel raw material was insufficient.

From comparison between the present invention examples and the comparative examples, it has become clear that, compared with the conventional chromium-molybdenum steel, the gear 8 and the manufacturing method thereof of the present invention provide higher tooth root fatigue strength, and the same or superior characteristics in other respects, in spite of using less amounts of Cr and Mo to reduce material cost.

Figure 11:
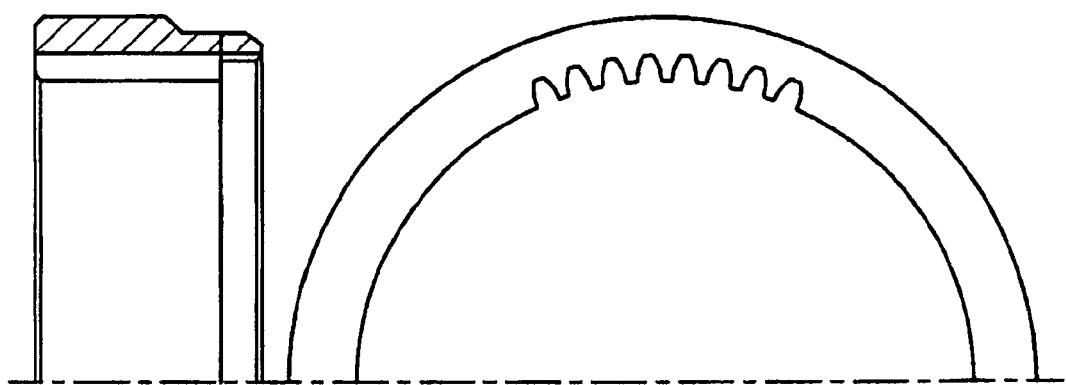
FIG. 11 is a drawing of another example of the gear to which the present invention can be applied.

Note that the present embodiment and the example are only illustrative examples, and do not limit the present invention. Accordingly, as a matter of course, various improvements and modifications can be made to the present invention without departing from the gist thereof. For example, in the above-described example, description has been made of an external gear, as the gear 8, in which the tooth portions 81 are formed outward. However, the present invention is not limited to the external gear, but can be applied to an internal gear (such as a ring gear of a planetary gear device) as shown in FIG. 11, or to a bevel gear. Regarding the positional relationships of the quench-hardened layers and others, it should be noted that, in the case of the internal gear, the outside in the radial direction corresponds to the expression "below" or "deep". Note that, although FIG. 11 is drawn with a part of the gear omitted, tooth profiles are actually formed over the entire circumference, as a matter of course.

The invention claimed is:

1. A gear, comprising:
   a disk portion; and
   a plurality of tooth portions that are circumferentially formed in a discrete manner on the disk portion,
   wherein
      the gear is subjected to carburizing treatment and then quenching treatment by high-density energy heating after formation of the gear, wherein
      a raw material steel of the gear has the following chemical composition:
         C: 0.1% to 0.40% by mass;
         Si: 0.35% to 3.0% by mass;
         Mn: 0.1% to 3.0% by mass;
         Cr: less than 0.2% by mass;
         Mo: 0.1% or less by mass;
         P: 0.03% or less by mass;
         S: 0.15% or less by mass;
         Al: 0.05% or less by mass;
         N: 0.03% or less by mass; and
         Fe and unavoidable impurities: remainder,
      the gear includes a first quenched-hardened layer that has a higher C concentration than the C concentration of the raw material steel and includes a martensitic structure, the first quench-hardened layer being formed throughout (i) a surface layer portion of each of the tooth portions and (ii) a surface layer portion of a tooth root portion that is a portion between the tooth portions on the disk portion,
      the gear includes a second quench-hardened layer that has a C concentration the same as the C concentration of the raw material steel and includes a martensitic structure, the second quench-hardened layer being formed throughout (i) an interior tooth portion encompassing the entire interior volume of each of the tooth portions other than the portion serving as the first quench-hardened layer, (ii) a portion of the disk portion lying below the first quench-hardened layer of the tooth root portion, and (iii) a portion of the disk portion lying under each of the tooth portions directly below the interior tooth portion, and the gear includes an unquenched region of the disk portion that has a C concentration the same as the C concentration of the raw material steel and includes no martensitic structure, the unquenched region of the disk portion lying deeper than the second quench-hardened layer.

2. The gear according to claim 1, wherein the C concentration of the first quench-hardened layer is 0.60% to 0.85% by mass on a surface thereof and is gradually reduced inside toward a boundary with the second quench-hardened layer.

3. The gear according to claim 1, wherein the chemical composition of the raw material steel further contains:
Ti: 0.005% to 0.2% by mass and
B: 0.0006% to 0.005% by mass.

4. The gear according to claim 1, wherein Mo content in the chemical composition of the raw material steel is less than 0.01%.

5. The gear according to claim 1, wherein the chemical composition of the raw material steel further contains either or both of:
Nb: 0.01% to 0.3% by mass and
V: 0.01% to 0.2% by mass.

6. The gear according to claim 1, wherein the chemical composition of the raw material steel further contains Ni: 0.1% to 3.0% by mass.

7. The gear according to claim 1, wherein a combination of the first quench-hardened layer and the second quench-hardened layer extends to a depth ranging from 2.0 mm to 5 mm when measured from the surface layer portion of the tooth portion to a boundary between the second quench-hardened layer and the region of the disk portion lying deeper than the second quench-hardened layer.

8. The gear according to claim 7, wherein the combination of the first quench-hardened layer and the second quench-hardened layer extends to a depth ranging from 2.6 mm to 5 mm.

9. The gear according to claim 1, wherein the first quench-hardened layer extends to a depth ranging from 0.8 mm to about 1.3 mm when measured from the surface layer portion of the tooth portion to a boundary between the first quench-hardened layer and the second quench-hardened layer.

10. The gear according to claim 9, wherein the first quench-hardened layer extends to a depth of about 0.9 mm.

11. The gear according to claim 1, wherein a content of Cr in the raw material steel of the gear is greater than 0% by mass.

12. The gear according to claim 1, wherein the gear is adapted for use in a vehicle drive train system.

13. The gear according to claim 1, wherein in the second quench-hardened layer, the (ii) portion of the disk portion lying below the first quench-hardened layer of the tooth root portion is adjacent to the (iii) portion of the disk portion lying under each of the tooth portions that is directly below the interior tooth portions.

* * * * *